(12) United States Patent
Sugimoto et al.

(10) Patent No.: US 11,394,352 B2
(45) Date of Patent: Jul. 19, 2022

(54) TRANSIMPEDANCE AMPLIFIER CIRCUIT

(71) Applicant: SUMITOMO ELECTRIC INDUSTRIES, LTD., Osaka (JP)

(72) Inventors: Yoshiyuki Sugimoto, Osaka (JP); Keiji Tanaka, Osaka (JP); Seiji Kumagai, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/097,348

(22) Filed: Nov. 13, 2020

(65) Prior Publication Data

US 2021/0159858 A1 May 27, 2021

(30) Foreign Application Priority Data

Nov. 21, 2019 (JP) .............................. JP2019-210333

(51) Int. Cl.
*H03F 1/42* (2006.01)
*H03F 3/45* (2006.01)

(52) U.S. Cl.
CPC .............. *H03F 1/42* (2013.01); *H03F 3/4508* (2013.01); *H03F 2200/36* (2013.01)

(58) Field of Classification Search
CPC ...... H03F 1/42; H03F 3/4508; H03F 2200/36; H03F 1/22; H03F 3/08
USPC ............. 330/252, 296.285, 276.59, 320, 308
See application file for complete search history.

(56) References Cited

U.S. PATENT DOCUMENTS 6,114,913 A 9/2000 Entrikin

*Primary Examiner* — Khanh V Nguyen
*Assistant Examiner* — Khiem D Nguyen
(74) *Attorney, Agent, or Firm* — IPUSA, PLLC

(57) ABSTRACT

A transimpedance amplifier circuit for generating an output voltage in accordance with an input current includes an offset resistor, a common emitter inverting amplifier having a first input and a first output, the first input receiving the input current, an emitter follower having a second input and a second output, the second input being coupled to the first output through the offset resistor, the second output outputting the output voltage, a feedback resistor connected between the second output and the first input, a variable current source connected to a node between the offset resistor and the second input, the variable current source configured to provide an offset current to the offset resistor, the offset current having a current value varied in accordance with a control signal, and a control circuit configured to generate the control signal so that an average voltage of the first output approaches a preset voltage value.

8 Claims, 7 Drawing Sheets

TRANSIMPEDANCE AMPLIFIER CIRCUIT

CROSS REFERENCE TO RELATED APPLICATIONS

The present application is based on and claims priority to Japanese Patent Application No. 2019-210333, filed on Nov. 21, 2019, the entire contents of which are incorporated herein by reference.

TECHNICAL FIELD

The disclosures herein relate to a transimpedance amplifier circuit.

BACKGROUND

A transimpedance amplifier (i.e., TIA) amplifies and converts a minute current signal generated by a photodiode or the like into a voltage signal output. A transimpedance amplifier is used in a receiver for optical fiber communications, for example. The circuit configuration of a transimpedance amplifier includes a common emitter amplifier, an emitter follower, and a feedback resistor element connected between the input of the common emitter amplifier and the output of the emitter follower, for example. In such a transimpedance amplifier, a current signal applied to the input of the common emitter amplifier is amplified and converted into a voltage signal which is output at the output of the emitter follower.

The common emitter amplifier includes an input transistor for receiving an input current, a cascode transistor cascode-connected to the input transistor, and a resistor element connected between the cascode transistor and a power supply line, for example. In such a common emitter amplifier, the input transistor amplifies a voltage responsive to the input current, and the amplified voltage is output at the collector of the cascode transistor. The emitter follower receives at the base thereof a collector voltage of the cascode transistor to output at the output terminal thereof an output voltage responsive to the collector voltage.

In a transimpedance amplifier having a common emitter amplifier and a cascode transistor, an increase in the input current causes an increase in the voltage drop across the feedback resistor element. As the voltage at the output terminal decreases as a result of this, the collector voltage of the cascode transistor decreases. The larger the input current is, the larger the decrease in the collector voltage is. The collector voltage relative to a reference potential (e.g., the ground potential) may drop more than a predetermined voltage below the base voltage of the cascode transistor. In such a case, the base-collector capacitance of the cascode transistor increases, which degrades the frequency characteristics (e.g., bandwidth) of the transimpedance amplifier.

SUMMARY

According to the present disclosures, a transimpedance amplifier circuit configured to generate an output voltage in accordance with an input current includes an input terminal configured to receive the input current from an external photo detector, an output terminal configured to output the output voltage, a first resistor, a first transistor having a first control terminal, a first inflow terminal, and a first outflow terminal, the first control terminal being coupled to the input terminal, the first outflow terminal being coupled to a ground line, a second transistor having a second control terminal, a second inflow terminal, and a second outflow terminal, the second control terminal configured to receive a first static voltage, the second inflow terminal being coupled to a power line through the first resistor, the second outflow terminal being coupled to the first inflow terminal of the first transistor, a second resistor having a first end and a second end, the first end being coupled to the second inflow terminal of the second transistor, a constant current source, a third transistor having a third control terminal, a third inflow terminal, and a third outflow terminal, the third control terminal being coupled to the second end of the second resistor, the third inflow terminal being coupled to the power line, the third outflow terminal being coupled to the ground line through the constant current source and being coupled to the output terminal, a feedback resistor connected between the first control terminal of the first transistor and the third outflow terminal of the third transistor, a variable current source coupled to the second end of the second resistor, the variable current source being configured to provide an offset current to the second resistor, the offset current having a current value varied in accordance with a control signal, and a control circuit configured to generate the control signal so that an average voltage of the second inflow terminal of the second transistor approaches a preset voltage value.

DETAILED DESCRIPTION

Figure 1:
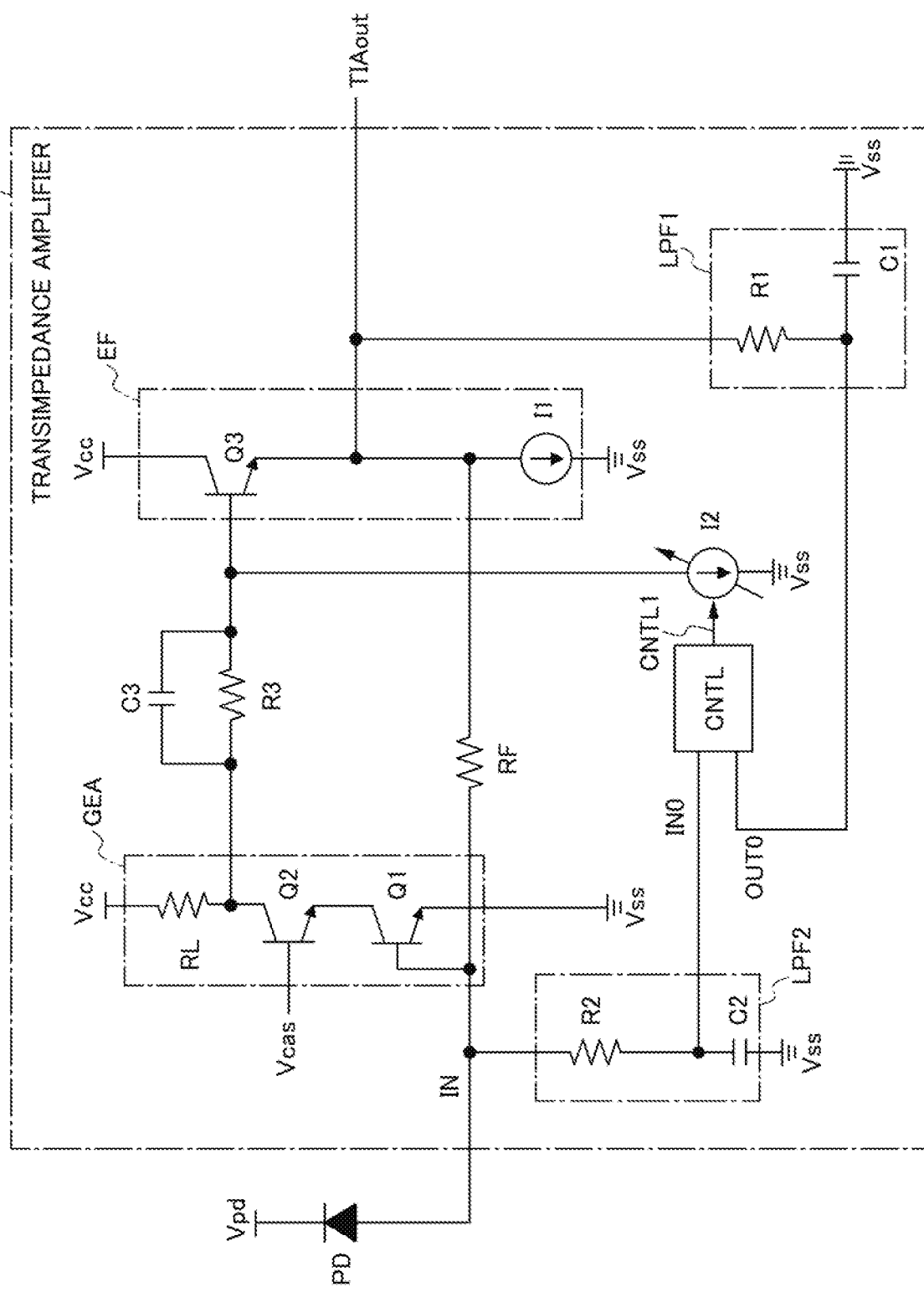
FIG. 1 is a drawing illustrating an example of the configuration of a transimpedance amplifier according to a first embodiment.

In the following, specific examples of transimpedance amplifiers of the present disclosures will be described with reference to the accompanying drawings. In the following description, the same or corresponding elements are referred to by the same reference characters, and a description thereof may be omitted as appropriate. Further, reference characters for input terminals, output terminals, and nodes are also used as reference characters for referring to signals, voltages, or currents. Reference characters for power supply terminals (inclusive of ground terminals) are also used as reference characters for referring to power supply voltages or power supply lines.

The collector and emitter of a transistor are examples of current terminals, and the base of a transistor is an example of a control terminal. The current terminals include an inflow terminal through which a current flows into a transistor, and include an outflow terminal through which a current flows out of a transistor. In an NPN bipolar transistor, for example, the collector is an inflow terminal, and the emitter is an outflow terminal. The voltage of an inflow terminal in a circuit is set higher than the voltage of an outflow terminal. The gate of a MOS (metal oxide semiconductor) transistor is an example of a control terminal. The source and drain of a MOS transistor are examples of current terminals. To be more specific, the drain and source of an n-channel MOS transistor is an inflow terminal and an outflow terminal, respectively. In a circuit, the voltage of an inflow terminal is set higher than the voltage of an outflow terminal. It may be noted that a MOSFET is sometimes used as a variable resistance element. In such a case, the drain may serve as any one of an inflow terminal and an outflow terminal. The source may also serve as any one of an inflow terminal and an outflow terminal. In the case of use as a variable resistance element, the drain and source of a MOSFET may sometimes be used interchangeably.

First Embodiment

[Circuit Configuration of Transimpedance Amplifier]

FIG. 1 is a drawing illustrating an example of the configuration of a transimpedance amplifier circuit (i.e., TIA circuit) according to a first embodiment. A TIA circuit 101 illustrated in FIG. 1 converts a current signal (e.g., photo current), generated through photoelectric conversion by a light receiving device (e.g., photo director) PD, for example, into a voltage signal, and outputs the converted voltage signal from an output terminal TIAout. The light receiving device PD may be a PIN photodiode or an avalanche photodiode (APD), for example. The light receiving device PD is arranged such that a cathode is connected to a bias line Vpd and an anode is connected to an input terminal IN of the TIA circuit 101, for example.

The TIA circuit 101 includes a common emitter amplifier GEA connected between a power supply line Vcc and a ground line Vss. The common emitter amplifier GEA includes a resistor element RL (i.e., a first resistor element) and bipolar transistors Q2 and Q1 (i.e., a second transistor and a first transistor), for example. The resistor element RL is connected to the power supply line Vcc, and the transistor Q1 is connected to the ground line Vss. The transistor Q2 is connected between the resistor element RL and the transistor Q1. The resistor element RL, the transistor Q2, and the transistor Q1 are connected in series in the order named. The TIA circuit 101 includes an emitter follower circuit EF connected between the power supply line Vcc and the ground line Vss. The emitter follower circuit EF includes a bipolar transistor Q3 (i.e., a third transistor) and a current source I1, for example. The TIA circuit 101 further includes a feedback resistor element RF, low-pass filters LPF1 and LPF2, a control circuit CNTL, a variable current source I2, a capacitor element C3, and a resistor element R3 (i.e., a second resistor element). In the following, the bipolar transistors Q1, Q2, and Q3 will simply be referred to as transistors Q1, Q2, and Q3, respectively.

In the common emitter amplifier GEA, the resistor element RL has one end thereof connected the power supply line Vcc and the other end thereof connected to the collector (i.e., fourth current terminal) of the transistor Q2. The transistor Q2 has an emitter (i.e., third current terminal) connected to the collector (i.e., second current terminal) of the transistor Q1 and a base (i.e., second control terminal) connected to a cascode bias line Vcas. The transistor Q1 has an emitter (i.e., first current terminal) connected to the ground line Vss and a base (i.e., first control terminal) connected to the input terminal IN. The input of the common emitter amplifier GEA is the base of the transistor Q1, and the output of the common emitter amplifier GEA is the collector of the transistor Q2, for example. The output of the common emitter amplifier GEA is connected to the input of the emitter follower circuit EF through the capacitor element C3 and the resistor element R3 which are connected in parallel with each other.

In the common emitter amplifier GEA, an increase in the base voltage of the transistor Q1 causes an increase in the collector current of the transistor Q1. The collector current of the transistor Q1 flows through the resistor element RL, with the transistor Q2 intervening therebetween. An increase in the collector current of the transistor Q1 causes an increase in the voltage drop across the resistor element RL, thereby causing reduction (lowering) in the collector voltage of the transistor Q2. Reduction in the base voltage of the transistor Q1 causes reduction in the collector current of the transistor Q1, which causes reduction in the voltage drop across the resistor element RL, thereby causing an increase (i.e., rise) in the collector voltage of the transistor Q2. Accordingly, an increase in the voltage applied to the base of the transistor Q1 causes reduction in the voltage output at the collector of the transistor Q2, and reduction in the voltage applied to the base of the transistor Q1 causes an increase in the voltage output at the collector of the transistor Q2. In this manner, the common emitter amplifier GEA functions as an inverting amplifier.

The common emitter amplifier GEA illustrated in FIG. 1 is such that the transistor Q2 is cascode-connected to the transistor Q1 to reduce the Miller capacitance of the transistor Q1. Applying a DC voltage to the base of the transistor Q2 via the cascode bias line Vcas causes the collector voltage of the transistor Q1 to be maintained at a constant level, thereby serving to reduce deterioration in frequency characteristics caused by the Miller effect of the base-collector capacitance. With this arrangement, the common emitter amplifier GEA is able to amplify a wide range of input signal frequencies.

In the emitter follower circuit EF, the transistor Q3 has a collector (i.e., sixth current terminal) thereof connected to the power supply line Vcc and a base (i.e., third control terminal) thereof connected to the collector of the transistor Q2 via a circuit constituted by the parallel-connected capacitor element C3 and resistor element R3. The emitter (i.e., fifth current terminal) of the transistor Q3 is connected to the output terminal TIAout, the current source I1, and the feedback resistor element RF. The input of the emitter follower circuit EF is the base of the transistor Q3, and the output of the emitter follower circuit EF is the emitter of the transistor Q3, for example. The output of the emitter follower circuit EF is connected to the low-pass filter LPF1. The capacitor element C3 is connected in parallel to the resistor element R3 to reduce degradation in frequency characteristics caused by the resistor element R3 at high frequencies. Namely, the capacitor element C3 serves as a speed-up capacitor that allows high frequency components of the amplified signal to pass. The feedback resistor element RF is connected between the input terminal IN and the output terminal TIAout. The input terminal IN is the input of the TIA circuit 101, and the output terminal TIAout is the output of the TIA circuit 101.

The low-pass filter LPF1 is connected between the output terminal TIAout and the ground line Vss. The low-pass filter LPF1 includes a resistor element R1 and a capacitor element C1. One end of the resistor element R1 is connected to the output terminal TIAout. The other end of the resistor element R1 is connected to one end of the capacitor element C1. The other end of the capacitor element C1 is connected to the ground line Vss. The low-pass filter LPF1 outputs, at the connecting node connecting the resistor element R1 and the capacitor element C1, an average voltage OUT0 (i.e., direct-current (DC) voltage) of the output signal TIAout over time. Namely, the low-pass filter LPF1 functions as a smoothing circuit (i.e., second smoothing circuit) that outputs a voltage (i.e., second detection signal) obtained by smoothing the voltage of the output signal TIAout over time for the purpose of controlling the variable current source I2, which will be described later. The smoothing circuit may also be referred to as an integration circuit. The purpose of the low-pass filter LPF1 is to detect the average voltage OUT0 of the output signal TIAout. It is preferable for the input impedance of the low-pass filter LPF1 as viewed from the output side of the emitter follower circuit EF to be as large a value as possible. Use of a large input impedance of the low-pass filter LPF1 makes it possible to reduce an effect on the output signal of the TIA circuit 101. In consideration of this, the value of the resistor element R1 is preferably greater than or equal to 50 KΩ, for example.

The low-pass filter LPF2 is connected between the input terminal IN and the ground line Vss. The low-pass filter LPF2 includes a resistor element R2 and a capacitor element C2. One end of the resistor element R2 is connected to the input terminal IN. The other end of the resistor element R2 is connected to one end of the capacitor element C2. The other end of the capacitor element C2 is connected to the ground line Vss. An average voltage IN0 (i.e., DC voltage) of the input signal IN over time is output at the connecting node connecting the resistor element R2 and the capacitor element C2. Namely, the low-pass filter LPF2 functions as a smoothing circuit (i.e., first smoothing circuit) that outputs a voltage (i.e., first detection signal) obtained by smoothing the voltage of the input signal IN over time for the purpose of controlling the variable current source I2, which will be described later. The smoothing circuit may also be referred to as an integration circuit. The purpose of the low-pass filter LPF2 is to detect the average voltage IN0 of the input signal IN. It is preferable for the input impedance of the low-pass filter LPF2 as viewed from the input terminal IN to be as large a value as possible. Use of a large input impedance of the low-pass filter LPF2 makes it possible to reduce an effect on the input signal into the TIA circuit 101. In consideration of this, the value of the resistor element R2 is preferably greater than or equal to 50 KΩ, for example.

An increase in the current of the input signal IN causes an increase in the voltage drop across the feedback resistor element RF through which the input signal IN flows, thereby resulting in reduction in the output voltage TIAout, for example. The average voltage OUT0 thus decreases in response to an increase in the average voltage IN0. Further, the base voltage of the transistor Q3 of the emitter follower circuit EF drops by following the reduction in the output voltage TIAout through the base-emitter voltage of the transistor Q3.

The variable current source I2 is connected between the input of the emitter follower circuit EF and the ground line Vss, for example, for the purpose of providing a direct current (i.e., offset current) flowing through the resistor element R3. The control circuit CNTL receives the average voltages OUT0 and IN0 (i.e., the second detection signal and the first detection signal) output from the low-pass filters LPF1 and LPF2, respectively, to generate a control signal CNTL1. The variable current source I2 generates a DC current (i.e., offset current) in response to the control signal CNTL1.

As an example, the control circuit CNTL generates the control signal CNTL1 that causes the variable current source I2 to generate an offset current responsive to a difference between the average voltage IN0 and the average voltage OUT0 when the average voltage OUT0 decreases in response to an increase in the input current IN. Namely, the control circuit CNTL generates the control signal CNTL1 that causes an increase in the amount of current flowing through the variable current source I2 in response to a decrease in the average voltage OUT0 relative to the average voltage IN0. In other words, the control circuit CNTL is such that the lower the output voltage TIAout relative to the input voltage IN is, the larger the offset current generated by the variable current source I2 is. It may be noted that, when the amount of current of the input signal IN is relatively small, namely, when the intensity of an optical signal input into the light receiving device PD is relatively small, the output voltage TIAout becomes relatively high. Because of this, the current flowing through the resistor element R3 may properly be set to zero. It follows that the control circuit CNTL may generate a control signal CNTL1 that causes the DC current supplied by the variable current source I2 to become zero when the average voltage IN0 is less than the average voltage OUT0.

When a DC current generated by the variable current source I2 flows through the resistor element R3, the voltage (i.e., average voltage) at one end of the resistor element R3 (the same node as the collector of the transistor Q2) is higher than the voltage (i.e., average voltage) at the other end of the resistor element R3 due to voltage drop across the resistor element R3. In this manner, the control circuit CNTL utilizes the average voltage OUT0 (i.e., second detection signal) of the output signal TIAout to monitor the average value of voltage drop across the feedback resistor element RF, thereby generating the control signal CNTL1 for controlling the amount of current of the variable current source I2. The control circuit CNTL is able to generate a potential difference between the opposite ends of the resistor element R3 in response to a reduction in the amount of the second detection signal.

The greater the amount of current supplied by the variable current source I2 is, the greater the DC current flowing through the resistor element R3 is, and, thus, the potential difference between the opposite ends of the resistor element R3 will increase. The average voltage of the output of the common emitter amplifier GEA thus increases relative to the average voltage of the input of the emitter follower circuit EF. Namely, the amount of a voltage rise (i.e., the amount of a voltage shift) from the base of the transistor Q3 to the collector of the transistor Q2 increases. With this arrangement, the average of the collector voltage of the transistor Q2 is likely to be prevented from decreasing, even when the average of the base voltage of the transistor Q3 decreases in response to a reduction in the average of the output voltage TIAout. As a result, the difference between the collector voltage of the transistor Q2 and the voltage Vcas (i.e., base voltage) applied to the base through the cascode bias line Vcas may be set within the range in which the transistor Q2 is able to perform normal amplification operations. This makes it unlikely for the degradation of frequency characteristics to occur in the TIA circuit 101.

More specifically, the input signal IN includes high frequency signal components, and the common emitter amplifier GEA amplifies these signal components to produce a voltage signal for output from the collector of transistor Q2. Namely, the collector voltage includes high frequency signal components, which are superimposed on the average of the collector voltage of the transistor Q2 for provision to the emitter follower circuit EF. When the amplitude of the signal components of the collector voltage is denoted as VM [V], the minimum value (i.e., bottom value) of the collector voltage is a voltage that is VM/2 below the average of the collector voltage. The difference between this bottom value and the base voltage Vcas is preferably set within the range in which the transistor Q2 is able to perform amplification operations without showing degradation in frequency characteristics.

As an example, a difference between the collector voltage and base voltage Vcas of the transistor Q2 is set such that the transistor Q2 operates in the active region for the respective voltages of the collector, base, and emitter of the transistor Q2. The collector voltage of the transistor Q2 is set such as to be always higher than the base voltage Vcas, for example. Alternatively, the amount of current supplied by the variable current source I2 is controlled such that the difference between the collector voltage and base voltage Vcas of the transistor Q2 becomes greater than or equal to a predetermined voltage. This arrangement serves to reduce the likelihood of the transistor Q2 operating in the saturated region. As a result, the likelihood of deterioration of frequency characteristics is reduced even when the input terminal IN receives a high-frequency input signal.

The control circuit CNTL generates the control signal CNTL1 for controlling the variable current source I2 based on the difference between the average voltage OUT0 (i.e., the second detection signal) and the average voltage IN0 (i.e., the first detection signal) which are obtained through smoothing by the low-pass filters LPF1 and LPF2, respectively. Namely, the control circuit CNTL controls the variable current source I2 based on the difference between the input voltage IN and the output voltage TIAout. With this arrangement, the difference between the collector voltage and base voltage of the transistor Q2 is properly set within the range in which the transistor Q2 operates normally even when a high-frequency input signal IN is converted into the output signal TIAout. This makes it unlikely for the degradation of frequency characteristics to occur in the TIA circuit 101.

[Circuit Configuration of Control Circuit CNTL]

Figure 2:
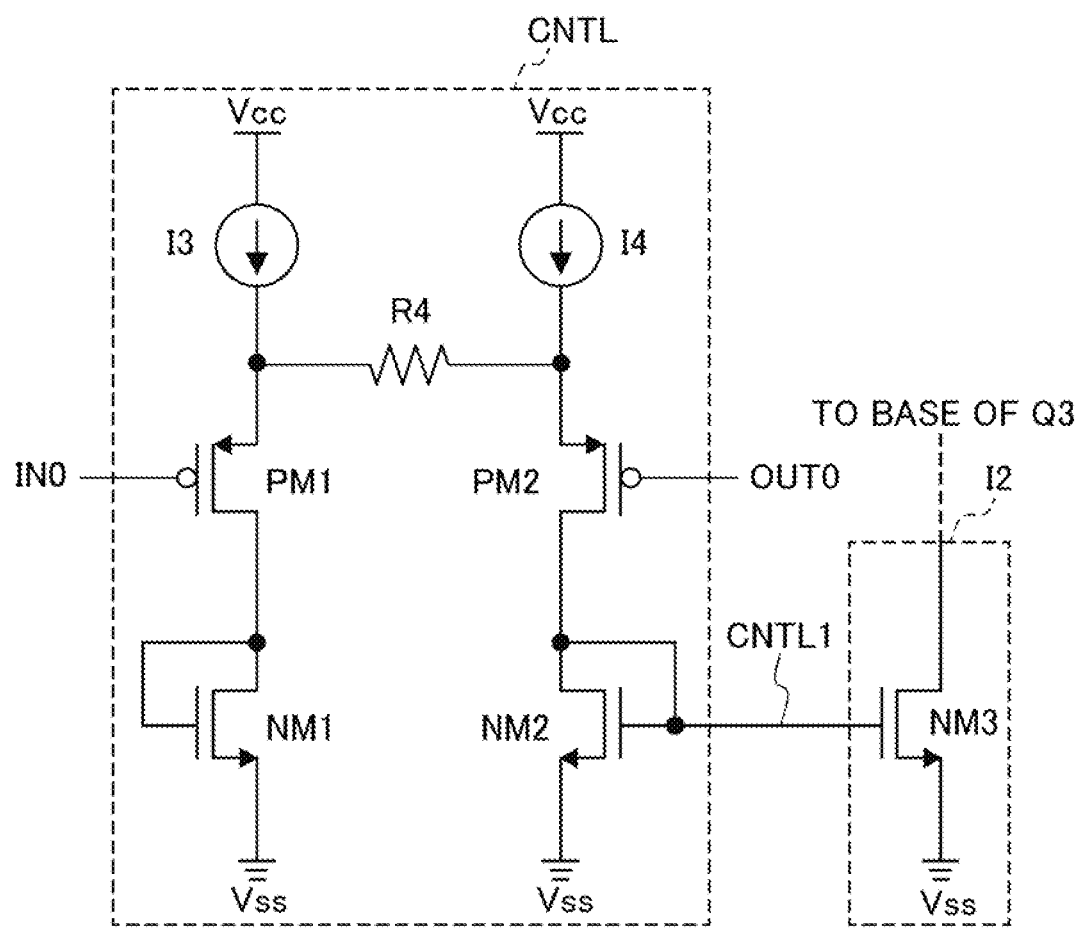
FIG. 2 is a circuit diagram illustrating an example of the configuration of a control circuit illustrated in FIG. 1.

FIG. 2 is a circuit diagram illustrating an example of the configuration of the control circuit CNTL illustrated in FIG. 1. The control circuit CNTL includes a current source I3, a p-channel MOS transistor PM1, and an n-channel MOS transistor NM1 connected in series between the power supply line Vcc and the ground line Vss. The control circuit CNTL further includes a current source I4, a p-channel MOS transistor PM2, and an n-channel MOS transistor NM2 connected in series between the power supply line Vcc and the ground line Vss. The source of the p-channel MOS transistor PM1 and the source of the p-channel MOS transistor PM2 are connected to each other via a resistor element R4. In the following, the p-channel MOS transistors and the n-channel MOS transistors will simply be referred to as MOS transistors.

The gate of the MOS transistor PM1 receives the average voltage IN0, and the gate of the MOS transistor PM2 receives the average voltage OUT0. The MOS transistors NM1 and NM2 are each connected to form a diode. The current sources I3 and I4, the MOS transistors PM1, NM1, PM2, and NM2, and the resistor element R4 together constitute a differential circuit.

In the control circuit CNTL illustrated in FIG. 2, an occurrence of an event in which the average voltage OUT0 becomes lower than the average voltage IN0 causes the current flowing through the MOS transistor NM2, among the sum of currents supplied by the current sources I3 and I4, to be greater than the current flowing through the MOS transistor NM1.

Conversely, an occurrence of an event in which the average voltage OUT0 is higher than the average voltage IN0 causes the current flowing through the MOS transistor NM2, among the sum of currents supplied by the current sources I3 and I4, to be less than the current flowing through the MOS transistor NM1.

The drain and gate of the MOS transistor NM2 are connected to the gate of the MOS transistor NM3 included in the variable current source I2 via a node CNTL1, so that the MOS transistors NM2 and NM3 constitute a current mirror circuit. The drain of the MOS transistor NM3 may be connected to the base of the transistor Q3 (i.e., connected to an end of the resistor element R3) illustrated in FIG. 1, for example, and the source of the MOS transistor NM3 may be connected to the ground line Vss.

With the arrangement noted above, the MOS transistor NM3 of the variable current source I2 has a current flowing therethrough equal in amount to the current which flows through the MOS transistor NM2 of the control circuit CNTL in response to the average voltages IN0 and OUT0, for example. Namely, an increase in a voltage drop from the average voltage IN0 to the average voltage OUT0 causes an increase in the current generated by the variable current source I2. As a result, the amount of current flowing through the resistor element R3 increases, and, thus, the potential difference between the opposite ends of the resistor element R3 increases. It may be noted that when the average voltage OUT0 is greater than a predetermined voltage above the average voltage IN0, the current flowing through the MOS transistor NM2 becomes zero, so that the DC current (i.e., offset current) supplied by the variable current source I2 also becomes zero.

In the first embodiment described above, the current (i.e., offset current) flowing through the resistor element R3 that connects the collector of the transistor Q2 and the base of the transistor Q3 is controlled in response to a decrease of the output voltage TIAout relative to the input voltage IN. With this arrangement, the output voltage of the common emitter amplifier GEA (i.e., the collector voltage of the transistor Q2) is likely to be prevented from decreasing, even when the input voltage of the emitter follower circuit EF (i.e., the base voltage of the transistor Q3) decreases by following a reduction in the output voltage TIAout. The difference between the collector voltage and base voltage Vcas of the transistor Q2 is thus properly set within the range in which the transistor Q2 operates in the active region even when the light receiving device PD supplies a large photo current. This makes it unlikely for the degradation of frequency characteristics to occur in the TIA circuit 101.

Second Embodiment

[Circuit Configuration of Transimpedance Amplifier]

Figure 3:
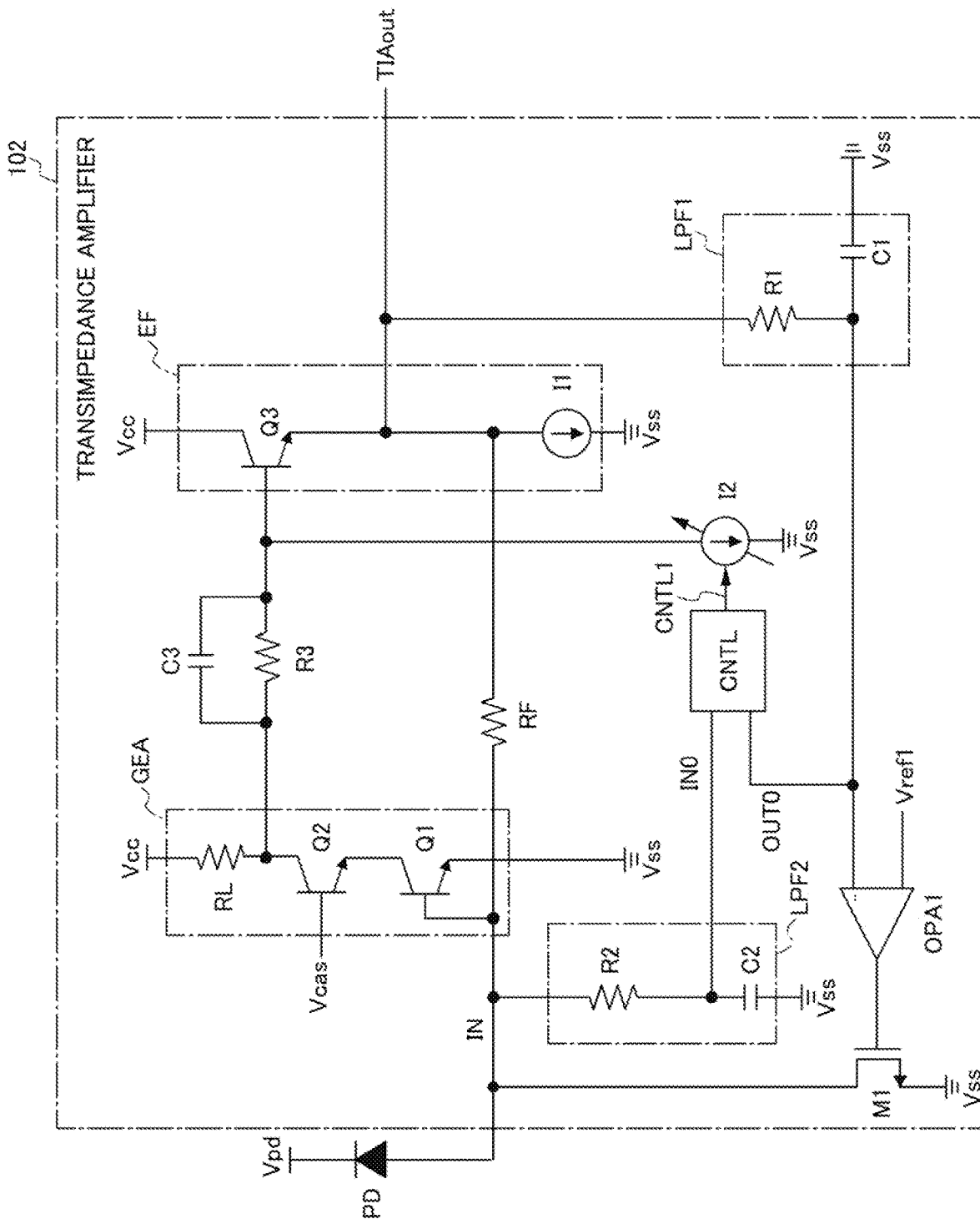
FIG. 3 is a circuit diagram illustrating an example of the configuration of a transimpedance amplifier according to a second embodiment.

FIG. 3 is a drawing illustrating an example of the configuration of a TIA circuit according to a second embodiment. The same elements as those of FIG. 1 are referred to by the same numerals, and a detailed description thereof will be omitted. A TIA circuit 102 illustrated in FIG. 3 differs from the TIA circuit 101 illustrated in FIG. 1 in that an n-channel MOS transistor M1 and an operational amplifier OPA1 are additionally provided. Other configurations of the TIA circuit 102 are substantially the same as those of the TIA circuit 101 illustrated in FIG. 1.

The MOS transistor M1 has a drain thereof connected to the input terminal IN, a source thereof connected to the ground line Vss, and a gate thereof connected to the output of the operational amplifier OPA1. The operational amplifier OPA1 supplies, to the gate of the MOS transistor M1, an output voltage generated in response to a difference between the average voltage OUT0 and a reference voltage Vref1, which are received at the differential inputs thereof. The reference voltage Vref1 is an example of a second reference voltage. The reference voltage Vref1 may be supplied from an external source or generated within the TIA circuit 102. The reference voltage Vref1 is a DC voltage, for example.

There may be a case in which the average voltage OUT0 is lower than the reference voltage Vref1, for example. In such a case, a raised output voltage of the operational amplifier OPA1 causes part of the input current IN flowing from the input terminal IN to the feedback resistor element RF to be drawn through the MOS transistor M1. With this arrangement, an increase in the current flowing through the feedback resistor element RF is reduced thereby to lower the voltage drop across the feedback resistor element RF even upon the occurrence of an increase in the input current IN. This arrangement thus serves to reduce the likelihood of lowering in the output voltage TIAout. For example, the average voltage OUT0 is applied to the inverting input terminal of the operational amplifier OPA1, and the reference voltage Vref1 is applied to the non-inverting input terminal of the operational amplifier OPA1. In such a case, the operational amplifier OPA1 performs inverting amplification, so that the output voltage increases as the input voltage decreases.

As an example, the bias of the MOS transistor M1 may be set such that the drain-source voltage of the MOS transistor M1 is greater than the gate voltage thereof, which allows the MOS transistor M1 to operate in the saturated region. When the MOS transistor M1 operates in the saturation region, the input impedance of the drain of the MOS transistor M1 as viewed from the input terminal IN is greater than the input impedance of the common emitter amplifier GEA. Because of this, more DC component (i.e., average current) of the input signal IN than the signal components thereof can be drawn through the MOS transistor M1. For example, the configuration may be arranged such that when the magnitude of the signal components drawn through the MOS transistor M1 is equal to 1, the magnitude of the DC component thereof is 100 or greater. The voltage gain (i.e., differential gain) of the operational amplifier OPA1 is not as large as $10^5$ or more as is commercially available. For example, a resistor element may be added between the input and the output, or a transistor with a relatively small transconductance may be used, thereby providing an operational amplifier OPA1 having a voltage gain as small as 10 to 100.

In the TIA circuit 102 illustrated in FIG. 3, feedback control may be performed such that the average voltage OUT0 and the reference voltage Vref1 are equal to each other, with the reference voltage Vref1 being set to an appropriate value. With this arrangement, the average voltage OUT0 may be kept constant regardless of the magnitude of the input current IN, so that the average value of the collector voltage of the transistor Q2 may also be kept constant. Current-to-voltage conversion is thus properly performed, without distortion in the relevant range of the input signal IN.

It may be noted that when the average value of the input current IN becomes large, there is an increase in the thermal noise of the MOS transistor M1 which is turned on to conduct a portion of the DC component of the input current IN. The thermal noise of the MOS transistor M1 is given by formula (1) shown below.

$$Id^2 = 4 \, kT((2/3)*gm)df \qquad (1)$$

In formula (1), id is a thermal noise current, and k is the Boltzmann constant, with T being the absolute temperature, gm being the transconductance of the MOS transistor M1, df being a minute frequency width, and the symbol "*" representing a product.

Because the MOS transistor's gm is proportional to the square root of source current, an increase in the current amplitude of the input signal IN results in an improved SN ratio (i.e., signal-to-noise ratio) in the case of an application with a constant degree of modulation. Examples of an application with a constant degree of modulation include a communication system which performs the direct detection of signal light at the light receiving device PD. In this type of communication system, the ratio between the power of signal light and the average power is always constant, so that the ratio between the amplitude of signal current of the photo current and the average current thereof is also constant.

On the other hand, in applications such as a digital coherent optical communication in which the DC current (i.e., the DC component of the input current IN) is substantially constant due to the use of local light, the reception sensitivity of the TIA circuit 102 may deteriorate due to an increase in thermal noise. Examples of an application in which the DC current is substantially constant due to the use of local light include a communication system which uses interference between signal light and local light to detect signals at the light receiving device PD. In general, the power of local light is sufficiently greater than the power of signal light. The average of photo current is thus substantially determined by the power of local light. In contrast, the amplitude of signal current is proportional to the square root of the product of the power of signal light and the power of local light, for example. In comparison with the application with a constant degree of modulation, therefore, the amplitude of signal current becomes smaller, and the average current becomes larger. Further, the ratio between the amplitude of signal current of the photo current and the average current thereof is not constant.

In the present embodiment, the DC current flowing through the MOS transistor M1 is decreased to reduce the degradation of reception sensitivity of the TIA circuit 102 which is caused by the thermal noise of the MOS transistor M1. To this end, the lowering of the output voltage TIAout is accepted, and the reference voltage Vref1 is set to the minimum limit of the acceptable output voltage TIAout. With this arrangement, the DC current flowing through the feedback resistor element RF increases, and the average of the output voltage TIAout decreases in accordance with the voltage drop across the feedback resistor element RF.

However, a decrease in the average of the output voltage TIAout causes the variable current source I2 to increase the amount of current flowing through the resistor element R3, thereby increasing the potential difference between the opposite ends of the resistor element R3. This reduces the likelihood that the average of the collector voltage of the transistor Q2 decreases by following the decrease in the average of the output voltage TIAout. As a result, with the reference voltage Vref1 being set low, the base-collector voltage of the transistor Q2 is properly set within the range in which the transistor Q2 operates normally even when the average of the output signal TIAout decreases This makes it unlikely for the degradation of frequency characteristics to occur.

More specifically, the input signal IN includes high frequency signal components, and the common emitter amplifier GEA amplifies these signal components to produce a voltage signal for output from the collector of transistor Q2. Namely, the collector voltage includes high frequency signal components, which are superimposed on the average of the collector voltage of the transistor Q2 for provision to the emitter follower circuit EF. When the amplitude of the signal components of the collector voltage is denoted as VM [V], the minimum value (i.e., bottom value) of the collector voltage is a voltage that is VM/2 below the average of the collector voltage. The difference between this bottom value and the base voltage Vcas is preferably set such that the transistor Q2 is able to perform amplification operations in the saturation region.

[Result of Circuit Simulation]

Figure 4:
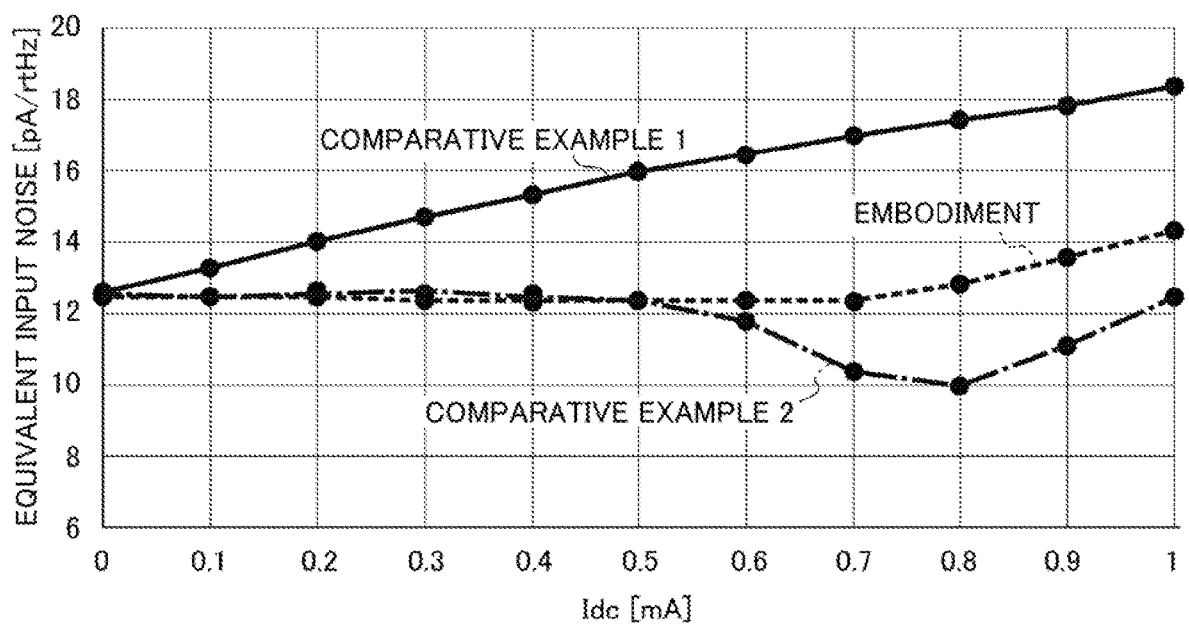
FIG. 4 shows the results of simulations that illustrate an example of changes in the average value of spectral density of equivalent input noise with respect to the average input current of the transimpedance amplifier illustrated in FIG. 3.
Figure 5:
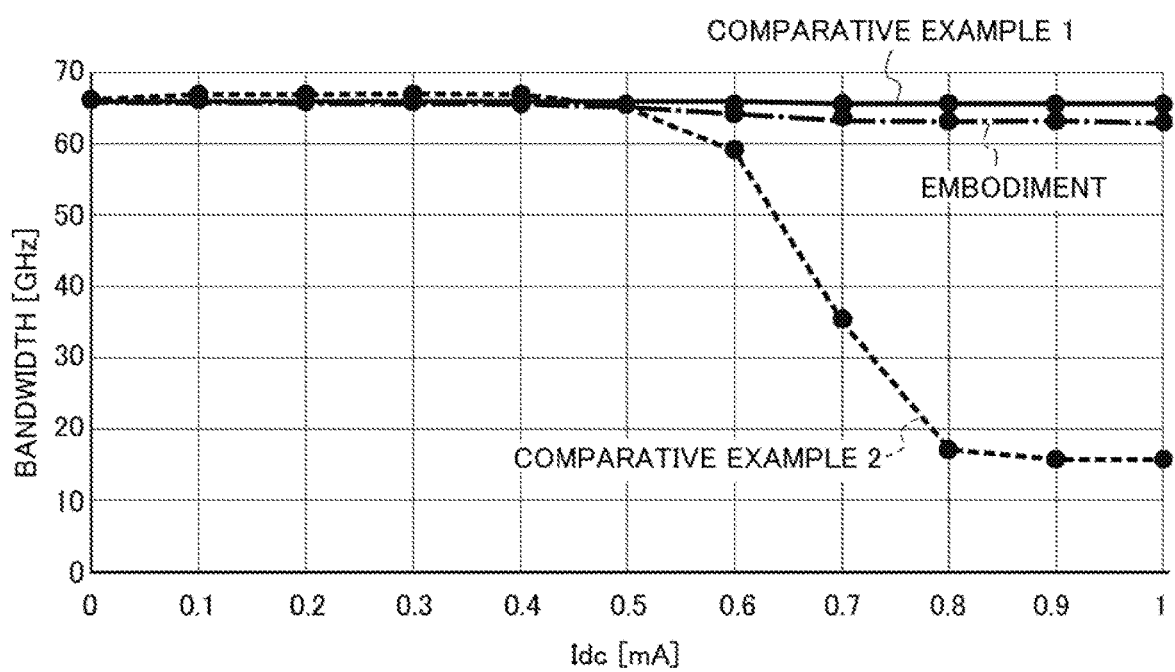
FIG. 5 shows the results of simulations that illustrate an example of changes in the 3-dB bandwidth of frequency characteristics with respect to the average input current of the transimpedance amplifier illustrated in FIG. 3.

FIG. 4 shows the results of simulations that illustrate an example of changes in the average value of spectral density of equivalent input noise current with respect to the average input current of the TIA circuit 102 illustrated in FIG. 3. FIG. 5 shows the results of simulations that illustrate an example of changes in the 3-dB bandwidth of frequency characteristics with respect to the average input current Idc of the input terminal IN of the TIA circuit 102 illustrated in FIG. 3. FIG. 4 and FIG. 5 show the results of simulations with respect to the TIA circuit 102 illustrated in FIG. 3.

The horizontal axis of FIG. 4 represents the average input current (i.e., DC current) Idc [mA] and the vertical axis of FIG. 4 represents the average of spectral density of equivalent input noise current [pA/rtHz]. The notation "rtHz" is the square root of frequency (Hz). In the following, the average of spectral density of equivalent input noise current will also be referred to simply as equivalent input noise. The horizontal axis of FIG. 5 represents the average input current Idc [mA] and the vertical axis of FIG. 5 represents the bandwidth.

In FIG. 4 and FIG. 5, COMPARATIVE EXAMPLE 1 illustrates characteristics observed when current is drawn through the n-channel MOS transistor M1 in accordance with the output voltage TIAout, regardless of the value of the average input current (DC component) Idc which is the average of the input current IN. Namely, in the case of COMPARATIVE EXAMPLE 1, the reference voltage Vref1 is set equal to the value of the output voltage TIAout that is observed when the input current is 0 mA, for example. In COMPARATIVE EXAMPLE 1, the control circuit CNTL is deactivated to set the current flowing through the variable current source I2 to 0 mA. COMPARATIVE EXAMPLE 1 is a first comparative example for the second embodiment of the present disclosures.

COMPARATIVE EXAMPLE 2 illustrates characteristics observed when the reference voltage Vref1 is set such that current is drawn through the MOS transistor M1 in accordance with the value of the average input current Idc when the average input current Idc exceeds 0.7 mA, for example. In COMPARATIVE EXAMPLE 2, the reference voltage Vref1 is set to 400 mV, for example. In COMPARATIVE EXAMPLE 2, the control circuit CNTL is deactivated to set the current flowing through the variable current source I2 to 0 mA. COMPARATIVE EXAMPLE 2 is a second comparative example for the second embodiment of the present disclosures. In COMPARATIVE EXAMPLE 1 and COMPARATIVE EXAMPLE 2, the control circuit CNTL is deactivated so that the current flowing through the variable current source I2 is set to zero.

EMBODIMENT illustrates characteristics observed when the reference voltage Vref1 is set such that current is drawn through the n-channel MOS transistor M1 in accordance with the value of the average input current Idc when the average input current Idc exceeds 0.7 mA. In EMBODIMENT, the reference voltage Vref1 is set to 400 mV, for example. In EMBODIMENT, the control circuit CNTL is activated to control the current flowing through the variable current source I2. Namely, EMBODIMENT is such that the variable current source I2 generates a current responsive to a decrease in the output voltage TIAout so as to create a potential difference between the opposite ends of the resistor element R3, thereby reducing the likelihood of lowering in the collector voltage of the transistor Q2 caused by the decrease in the output voltage TIAout. It should be noted that, in a semiconductor integrated circuit used as the TIA circuit 102 in the field application, values different from 0.7 mA and 400 mV described above may be utilized. EMBODIMENT corresponds to the second embodiment of the present disclosures.

In FIG. 4 and FIG. 5, COMPARATIVE EXAMPLE exhibits almost no bandwidth degradation over a range of the average input current Idc, but exhibits an increasing deterioration in the equivalent input noise with an increase in the average input current Idc. COMPARATIVE EXAMPLE 2 exhibits almost no deterioration of the equivalent input noise over a range of the average input current Idc, but exhibits a significant bandwidth degradation in the areas where the average input current Idc is relatively large. In COMPARATIVE EXAMPLE 2, no deterioration in the equivalent input noise is observed, but the bandwidth degrades as the average input current Idc increases. The TIA circuit is thus not operating normally.

EMBODIMENT exhibits a slight increase in the equivalent input noise in the area where the average input current Idc is relatively large, but such an increase in the equivalent input noise is relatively small compared with COMPARATIVE EXAMPLE 1. Further, in the case of EMBODIMENT, the bandwidth degradation over a range of the average input current Idc is relatively insignificant and less than a few GHz.

As described above, in the TIA circuit 102 illustrated in FIG. 3, the variable current source I2 generates a current in accordance with the amount of a voltage drop across the feedback resistor element RF, which enables the provision of an optical receiver in which almost no bandwidth degradation occurs while the likelihood of a noise increase caused by the input current IN is reduced.

Figure 6:
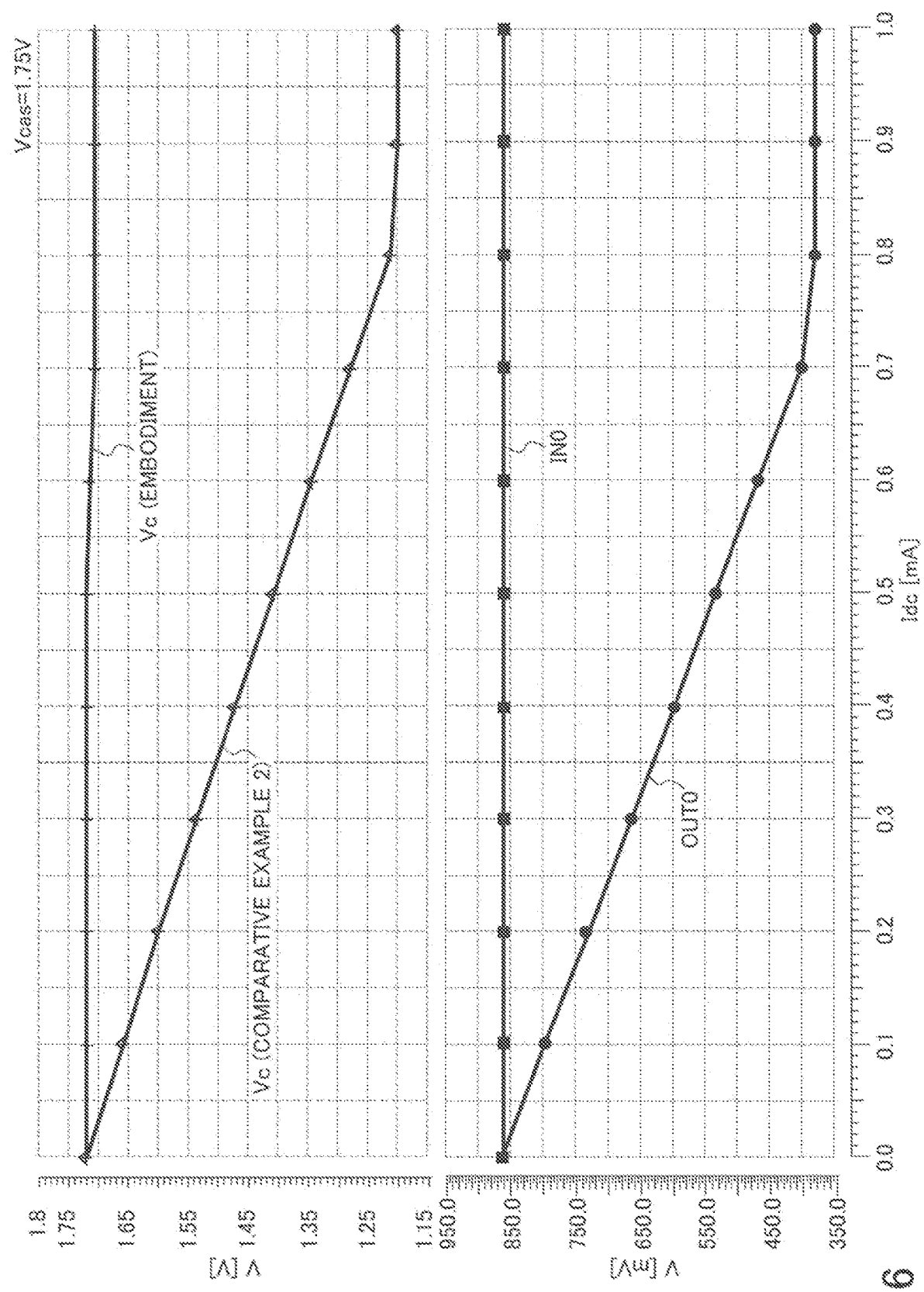
FIG. 6 shows the results of simulations that illustrate an example of changes in various voltages with respect to the input current of the transimpedance amplifier illustrated in FIG. 3.

FIG. 6 shows the results of simulations that illustrate an example of changes in various voltages with respect to the input current of the TIA circuit illustrated in FIG. 3. The horizontal axis of FIG. 6 represents the average input current Idc [mA] and the vertical axis of FIG. 6 represents the voltage [V] or [mV]. As non-limiting examples, the base voltage Vcas of the transistor Q2 may be set to 1.75 V, and the power supply voltage Vcc may be set to 2.5 V, for example.

The reference symbol Vc (EMBODIMENT) indicates the collector voltage of the transistor Q2 as observed when circuit simulation is conducted under the same conditions as those of EMBODIMENT described in connection with FIG. 4 and FIG. 5. Namely, the reference voltage Vref1 is set such that current is drawn through the MOS transistor M1 when the average input current Idc exceeds 0.7 mA. Further, the control circuit CNTL is activated to control the current flowing through the variable current source I2. The reference symbol Vc (EMBODIMENT) corresponds to the collector voltage of the transistor Q2 in the second embodiment of the present disclosures.

The reference symbol Vc (COMPARATIVE EXAMPLE 2) indicates the collector voltage of the transistor Q2 as observed when circuit simulation is conducted under the same conditions as those of EMBODIMENT described in connection with FIG. 3 and FIG. 4. Namely, the characteristics are such that the reference voltage Vref1 is set to draw a current through the MOS transistor M1 when the average input current Idc exceeds 0.7 mA, and such that the current flowing through the variable current source I2 is set to 0 mA. The reference symbol "IN0" indicates the average of the input signal IN, and the reference symbol "OUT0" indicates the average of the output voltage TIAout. The reference symbol Vc (COMPARATIVE EXAMPLE 2) corresponds to the collector voltage of the transistor Q2 in a comparative example for the second embodiment of the present disclosures.

In COMPARATIVE EXAMPLE 2, the collector voltage Vc (COMPARATIVE EXAMPLE 2) decreases by following a decrease in the average voltage OUT0 because no current flows from the resistor element R3 to the variable current source I2. As the average input current Idc becomes greater than or equal to 0.6 mA, the operating region of the transistor Q2 changes from the active region to the saturated region, which results in the transistor Q2 failing to operate normally. This results in the degradation of frequency characteristics of the TIA circuit 102.

In the case of EMBODIMENT, current flows from the resistor element R3 to the variable current source I2 in accordance with a decrease in the average voltage OUT0 of the output voltage TIAout, thereby creating a potential difference between the opposite ends of the resistor element R3. The collector voltage Vc (EMBODIMENT) is thus kept constant even when the average input current Idc increases. This allows the transistor Q2 to operate under the conditions that the operating region of the transistor Q2 is maintained in the active region, thereby reducing the likelihood of degradation of frequency characteristics in the TIA circuit 102. It may be noted that, to be more exact, what is kept constant is the average of collector voltage of the transistor Q2. A voltage signal amplified by the common emitter amplifier GEA is output from the collector of the transistor Q2 as described above, and is superimposed on the average voltage (i.e., DC component) of the collector voltage. The instantaneous value of the collector voltage can thus reach a voltage equal to the average voltage of the collector voltage minus the amplitude of the voltage signal.

After the average input current Idc exceeds 0.7 mA, current is drawn through the MOS transistor M1 in accordance with an increase in the average input current Idc. Accordingly, the average voltage OUT0 stops decreasing and becomes substantially constant after the average input current Idc exceeds 0.7 mA.

As described above, the second embodiment brings about substantially the same advantages as those of the first embodiment. In the second embodiment, further, a portion of the input current IN flows through the MOS transistor M1 when the output voltage TIAout decreases due to a voltage drop caused by the current flowing through the feedback resistor element RF. This arrangement thus serves to reduce the voltage drop across the feedback resistor element RF, thereby reducing a decrease in the output voltage TIAout.

Even when the current flowing through the MOS transistor M1 is decreased to reduce thermal noise, the variable current source I2 operates to create a potential difference between the opposite ends of the resistor element R3. This arrangement reduces the likelihood that the average of the collector voltage of the transistor Q2 decreases by following the average of the output voltage TIAout. For example, the control circuit CNTL causes the variable current source I2 to generate a DC current (i.e., offset current) flowing through the resistor element R3 to compensate for a reduction in the base voltage of the transistor Q3. As a result, even when the MOS transistor M1 is provided for the purpose of extracting a portion of the input current IN, the noted arrangement enables the reduction of deterioration of frequency characteristics while reducing an increase in the thermal noise of the MOS transistor M1. In other words, the control circuit CNTL, the variable current source I2, the resistor element R3, the operational amplifier OPA1, and the MOS transistors M1 serve to reduce the likelihood of a voltage drop at the relevant current terminal of the second transistor (i.e., the output voltage of the common emitter amplifier GEA).

The average voltage OUT0 output from the low-pass filter LPF1 is input into the operational amplifier OPA1. This arrangement makes it possible to control the amount of DC current of the input signal IN flowing through the MOS transistor M1 based on the average voltage OUT0, even when the high frequency input signal IN is converted into the output signal TIAout.

Third Embodiment

[Circuit Configuration of Transimpedance Amplifier]

Figure 7:
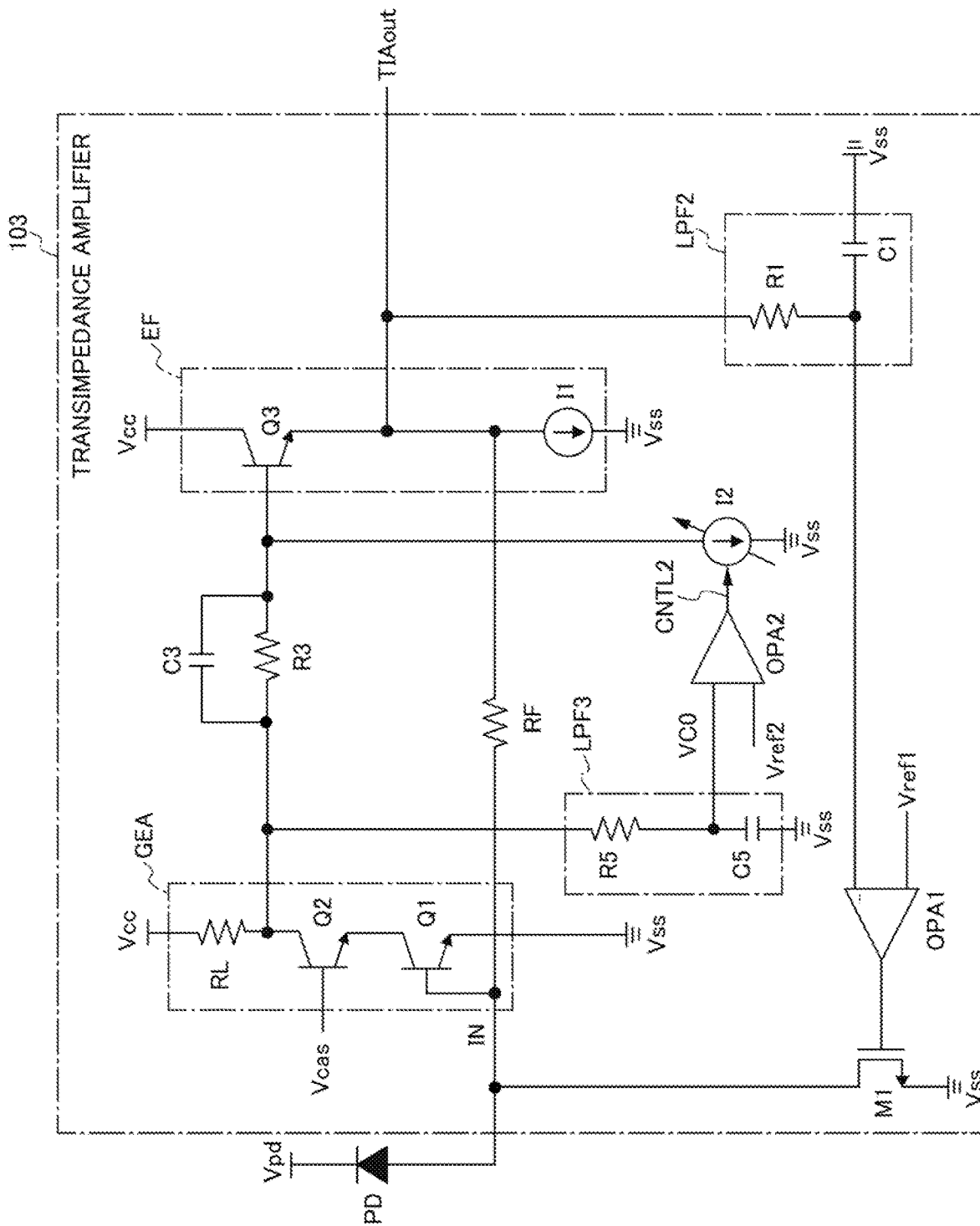
FIG. 7 is a circuit diagram illustrating an example of the configuration of a transimpedance amplifier according to a third embodiment.

FIG. 7 is a drawing illustrating an example of the configuration of a TIA circuit according to a third embodiment. The same elements as those of FIG. 1 are referred to by the same numerals, and a detailed description thereof will be omitted. The TIA circuit 103 illustrated in FIG. 7 includes a low-pass filter LPF3 and an operational amplifier OPA2 (i.e., control circuit) in place of the low-pass filter LPF2 and the control circuit CNTL of the TIA circuit 101 illustrated in FIG. 3. Other configurations of the TIA circuit 103 are substantially the same as those of the TIA circuit 102 illustrated in FIG. 3.

The low-pass filter LPF3 is connected between the collector of the transistor Q2 and the ground line Vss. The low-pass filter LPF3 includes a resistor element R5 and a capacitor element C5. One end of the resistor element R5 is connected to the collector of the transistor Q2. The other end of the resistor element R5 is connected to one end of the capacitor element C5. The other end of the capacitor element C5 is connected to the ground line Vss. The low-pass filter LPF3 outputs the average voltage VC0 (i.e., DC voltage) of collector voltage of the transistor Q2 from a connecting node VC0 connecting the resistor element R5 and the capacitor element C5. Namely, the low-pass filter LPF3 functions as a smoothing circuit that outputs a voltage (i.e., third detection signal) obtained by smoothing the collector voltage of the transistor Q2 for the purpose of controlling the variable current source I2. The smoothing circuit may also be referred to as an integration circuit. The purpose of the low-pass filter LPF3 is to detect the average voltage VC0 of the collector of the transistor Q2. It is preferable for the input impedance of the low-pass filter LPF3 as viewed from the collector of the transistor Q2 to be as large a value as possible. Use of a large input impedance of the low-pass filter LPF3 makes it possible to reduce an effect on the output signal of the common emitter amplifier GEA. In consideration of this, the value of the resistor element R5 is preferably greater than or equal to 50 KΩ, for example.

The operational amplifier OPA2 functions as a first differential amplifier that receives the average voltage VC0 and a reference voltage Vref2 at the differential inputs thereof, and outputs an output voltage CNTL2 (i.e., control signal) to the control input of the variable current source I2 in accordance with the voltages received at the differential inputs. For example, the average voltage VC0 is applied to the inverting input terminal of the operational amplifier OPA2, and the reference voltage Vref2 is applied to the non-inverting input terminal of the operational amplifier OPA2. In such a case, the operational amplifier OPA2 performs inverting amplification. The operational amplifier OPA2 and the variable current source I2 perform feedback control such that a DC current (i.e., offset current) flows through the resistor element R3 when the average voltage VC0 is lower than the reference voltage Vref2. The average voltage VC0 is thereby adjusted equal to the reference voltage Vref2. In other words, the operational amplifier OPA2 generates the control signal CNTL2 such that the lower the collector voltage of the transistor Q2 relative to the reference voltage Vref2 is, the larger the current produced by the variable current source I2 is. The reference voltage Vref2 is set equal to or greater than the base voltage Vcas of the transistor Q2, for example. The reference voltage Vref2 is an example of a first reference voltage.

Accordingly, even when a decrease in the average of the output voltage TIAout resulting from an increase in the input current IN causes reduction in the base voltage of the transistor Q3 (i.e., the input voltage of the emitter follower circuit EF), the difference between the collector voltage of the transistor Q2 (i.e., the output voltage of the common emitter amplifier GEA) and the base voltage Vcas is properly set within the range (i.e., the active region) in which the transistor Q2 operates normally. As a result, the degradation of frequency characteristics of the TIA circuit 103 is properly reduced.

[Result of Circuit Simulation]

Figure 8:
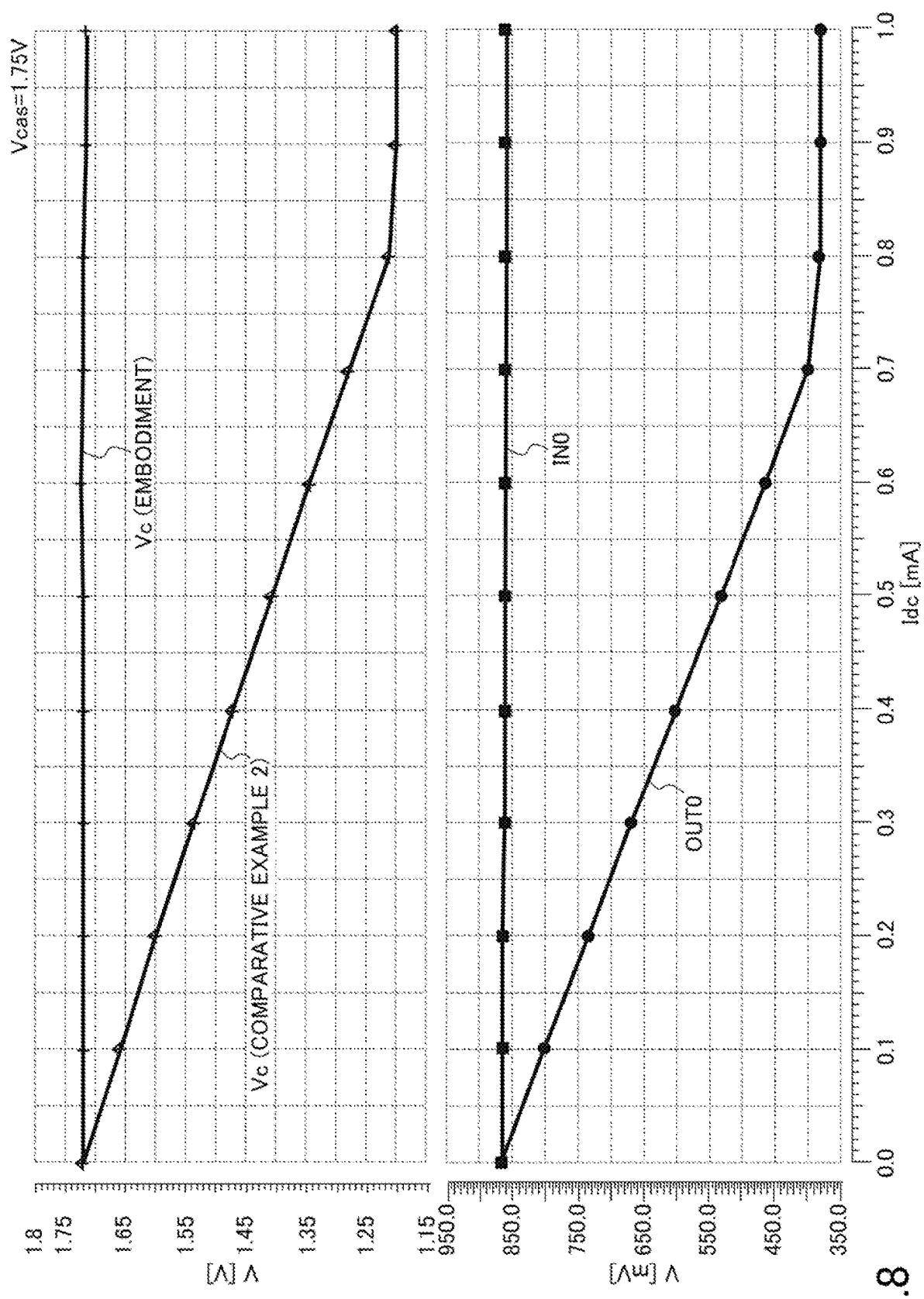
FIG. 8 shows the results of simulations that illustrate an example of changes in various voltages with respect to the input current of the transimpedance amplifier illustrated in FIG. 7.

FIG. 8 shows the results of simulations that illustrate an example of changes in various voltages with respect to the input current of the transimpedance amplifier illustrated in FIG. 7. A detailed description will be omitted with respect to the same elements as those of FIG. 6. The horizontal and vertical axes of FIG. 8 are the same as the horizontal and vertical axes of FIG. 6, respectively. The items illustrated as simulation curves are also the same as those of FIG. 6. Namely, the curves illustrated in FIG. 8 show the collector voltage Vc (EMBODIMENT) as obtained for the third embodiment, the collector voltage Vc (COMPARATIVE EXAMPLE 2) as obtained for the previously described "COMPARATIVE EXAMPLE 2" (corresponding to a comparative example for the third embodiment of the present disclosures), the average voltage IN0 of the input signal IN, and the average voltage OUT0 of the output voltage TIAout. The power supply voltage Vcc is 2.5 V, for example.

Similarly to FIG. 6, Vc (EMBODIMENT) in FIG. 8 shows that even when the output voltage TIAout decreases, the average of the collector voltage Vc is properly kept constant because the current flowing through the resistor element R3 generates a potential difference between the opposite ends of the resistor element R3. With this arrangement, the operating region of the transistor Q2 is properly kept within the active region. Namely, the likelihood of degradation of frequency characteristics is reduced in the TIA circuit 103.

The simulation results for the TIA circuit 103 of FIG. 7 are substantially the same as the simulation results illustrated in FIG. 4 and FIG. 5.

As described above, the third embodiment brings about substantially the same advantages as those of the first and second embodiments. In the third embodiment, the low-pass filter LPF3 and the operational amplifier OPA2 directly monitor the average value of collector voltage of the transistor Q2 so as to control the amount of current of the variable current source I2. The reference voltage Vref2 in this case may be set to the target value for the collector voltage of the transistor Q2. With such an arrangement, the collector voltage of the transistor Q2 is set such that the transistor Q2 operates in the active region, thereby reducing the likelihood of degradation of frequency characteristics in the TIA circuit 102. The reference voltage Vref2 is set equal to or greater than the base voltage Vcas of the transistor Q2, for example.

The bipolar transistors used in the embodiments described heretofore may be replaced with MOS transistors, and the MOS transistors used in the embodiments described heretofore may be replaced with bipolar transistors.

The embodiments of the present disclosures have been described heretofore, but the subject matter of the present disclosures is not limited to those embodiments. Various modifications, changes, replacements, additions, deletions, and combinations may be made without departing from the scope of the invention as recited in the claims. Those are intended to be within the technical scope of the present disclosures.

What is claimed is:

1. A transimpedance amplifier circuit configured to generate an output voltage in accordance with an input current, comprising:
    an input terminal configured to receive the input current from an external photo detector;
    an output terminal configured to output the output voltage;
    a first resistor;
    a first transistor having a first control terminal, a first inflow terminal, and a first outflow terminal, the first control terminal being coupled to the input terminal, the first outflow terminal being coupled to a ground line;
    a second transistor having a second control terminal, a second inflow terminal, and a second outflow terminal, the second control terminal configured to receive a first static voltage, the second inflow terminal being coupled to a power line through the first resistor, the second outflow terminal being coupled to the first inflow terminal of the first transistor;
    a second resistor having a first end and a second end, the first end being coupled to the second inflow terminal of the second transistor;
    a constant current source;

a third transistor having a third control terminal, a third inflow terminal, and a third outflow terminal, the third control terminal being coupled to the second end of the second resistor, the third inflow terminal being coupled to the power line, the third outflow terminal being coupled to the ground line through the constant current source and being coupled to the output terminal;

a feedback resistor connected between the first control terminal of the first transistor and the third outflow terminal of the third transistor;

a variable current source coupled to the second end of the second resistor, the variable current source being configured to provide an offset current to the second resistor, the offset current having a current value varied in accordance with a control signal; and a control circuit configured to generate the control signal so that an average voltage of the second inflow terminal of the second transistor is set to be higher than the first static voltage.

2. The transimpedance amplifier circuit as claimed in claim 1, wherein the control circuit controls the variable current source to vary the offset current so that the average voltage of the second inflow terminal of the second transistor is set to a voltage at which the second transistor operates in an active region.

3. The transimpedance amplifier circuit as claimed in claim 1, wherein the control circuit generates the control signal based on a difference between an average voltage of the input terminal and an average voltage of the output terminal.

4. The transimpedance amplifier circuit as claimed in claim 3, wherein the control circuit causes the offset current provided by the variable current source to increase, such that the lower the average voltage of the output terminal relative to the average voltage of the input terminal is, the greater the offset current is.

5. The transimpedance amplifier circuit as claimed in claim 3, further comprising:

a first smoothing circuit configured to produce a first detection signal obtained by smoothing a voltage of the input terminal; and a second smoothing circuit configured to produce a second detection signal obtained by smoothing the output voltage of the output terminal, wherein the control circuit is configured to generate the control signal based on the first detection signal and the second detection signal.

6. The transimpedance amplifier circuit as claimed in claim 1, wherein the control circuit is configured to generate the control signal by detecting the average voltage of the second inflow terminal of the second transistor and performing a feedback control based at least in part on the detected average voltage.

7. The transimpedance amplifier circuit as claimed in claim 6, wherein the control circuit includes a first differential amplifier that receives a first reference voltage and the average voltage of the second inflow terminal of the second transistor, and is configured such that the lower the average voltage of the second inflow terminal of the second transistor relative to the first reference voltage is, the greater the offset current is.

8. A transimpedance amplifier circuit configured to generate an output voltage in accordance with an input current, comprising:

an offset resistor;

a common emitter inverting amplifier having a first input and a first output, the first input configured to receive the input current;

an emitter follower having a second input and a second output, the second input being coupled to the first output of the common emitter inverting amplifier through the offset resistor, the second output configured to output the output voltage;

a feedback resistor connected between the second output of the emitter follower and the first input of the common emitter inverting amplifier;

a variable current source connected to a node between the offset resistor and the second input of the emitter follower, the variable current source being configured to provide an offset current to the offset resistor, the offset current having a current value varied in accordance with a control signal; and a control circuit configured to increase the offset current in response to a decrease in an average value of the output voltage by varying the control signal.

* * * * *